(12) United States Patent
Ohlhoff

(10) Patent No.: US 6,549,028 B1
(45) Date of Patent: Apr. 15, 2003

(54) CONFIGURATION AND PROCESS FOR TESTING A MULTIPLICITY OF SEMICONDUCTOR CHIPS ON A WAFER PLANE

(75) Inventor: Carsten Ohlhoff, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/630,972

(22) Filed: Aug. 2, 2000

(30) Foreign Application Priority Data

Aug. 2, 1999 (DE) .......................... 199 36 321

(51) Int. Cl.⁷ .............................................. G01R 31/28
(52) U.S. Cl. ........................................ 324/765; 324/754
(58) Field of Search .............................. 324/765, 766, 324/767, 754, 158.1, 763; 714/733, 734

(56) References Cited

U.S. PATENT DOCUMENTS

| | | | | |
|---|---|---|---|---|
| 5,241,266 A | * | 8/1993 | Ahmad et al. | 714/733 |
| 5,294,776 A | * | 3/1994 | Furuyama | 324/158.1 |
| 5,307,010 A | * | 4/1994 | Chiu | 324/766 |
| 5,399,505 A | * | 3/1995 | Dasse et al. | 438/17 |

* cited by examiner

Primary Examiner—Ernest Karlsen
(74) Attorney, Agent, or Firm—Laurence A. Greenberg; Werner H. Stemer; Ralph E. Locher

(57) ABSTRACT

Arrangement and method for testing a multiplicity of semiconductor chips at the wafer level The invention relates to an arrangement and a method for testing a multiplicity of semiconductor chips (7) at the wafer level, in which an intermediate wiring plane (10) with a global test bus (12) and test pads (11) is applied to the surface of the wafer (6).

5 Claims, 1 Drawing Sheet

CONFIGURATION AND PROCESS FOR TESTING A MULTIPLICITY OF SEMICONDUCTOR CHIPS ON A WAFER PLANE

BACKGROUND OF THE INVENTION

Field of the Invention

The present invention relates to an arrangement and a method for testing a multiplicity of semiconductor chips at the wafer level, in which test signals are applied to the semiconductor chips, which have bonding pads, by a tester device.

In order to satisfy requisite quality requirements, it is known for semiconductor chips to be tested repeatedly during their fabrication. In this case, the semiconductor chips are fabricated in such a way that, from one wafer, several hundred or even several thousand semiconductor chips are formed in parallel with one another. In other words, up to several thousand semiconductor chips are thus produced from a single semiconductor wafer.

The preferred material for the semiconductor wafers is silicon. However, it is also possible to use other materials, such as gallium arsenide for example.

Of the plurality of tests mentioned, what is tested in a first test is, for example, whether the semiconductor chips are all functional. This first test makes use of the fact that all the chips to be tested are still combined in the wafer. In other words, at least this test is performed at the wafer level.

If non-functional semiconductor chips or semiconductor chips having an inadequate operating behavior are detected during this first test, then these semiconductor chips are not completed any further, in order thereby to keep the fabrication costs of the semiconductor chips from the wafer as low as possible.

The test equipment required for carrying out the tests at the wafer level is extremely cost-intensive. This is due to the fact that as the complexity of the semiconductor chips increases, that is to say as the storage capacity rises in the case of semiconductor memories, for example, the test times become longer, so that ultimately, owing to the proportionality between test time and memory area size in the case of semiconductor memories, the test costs grow practically exponentially with each new generation of memories.

In order to prevent these test costs from rising to an excessively great extent, attempts have been made heretofore to test the greatest possible number of semiconductor chips in parallel with one another at the wafer level. For this purpose, special probe cards (PCBS) are used, containing a multiplicity of probe needles with which, by way of example, each time the probe card is lowered onto the wafer, eight or sixteen test units or DUTs ("Device Under Test") can be tested in parallel. In this case, one DUT may comprise a plurality of semiconductor chips.

In order, then, to completely test all the semiconductor chips on a wafer, it is necessary to perform a plurality of lowering operations with the probe cards. It goes without saying that each time the probe cards are lowered, an extremely precise positional relationship between probe card and wafer has to be adhered to since the probe needles each have to impinge on special bonding pads of the semiconductor chips. It should be noted here that a probe card can contain several hundred probe needles and the bonding pads have lateral dimensions of the order of magnitude of approximately 100 $\mu$m.

On account of this high number of probe needles per probe card and the precise alignment demanded between probe needles and bonding pads, the probe cards are inherently already extremely complex. The complexity for the probe cards is additionally increased by the fact that they cannot be used generally, since they have to be configured in a product-specific manner:

if a new product is present in the form of a new semiconductor chip, then the probe card has to be adapted to the bonding pads thereof. This applies even when, for example, the dimensions of an existing semiconductor chip are reduced.

For the reasons mentioned, therefore, existing tester devices are very complicated and extremely costly.

As the diameter of the wafers increases from, for example, 6 inches through 8 inches up to 12 inches and with decreasing structure dimensions or higher integration levels, the number of semiconductor chips per wafer rises tremendously. The number of probe needles per probe card cannot be increased arbitrarily. Therefore, the tests have to be performed sequentially with the existing tester devices at the wafer level, which likewise causes a considerable increase in the test times and thus also in the test costs.

In order to keep these test times and test costs somewhat under control, the tester devices have hitherto been continuously refined and improved. Nevertheless, a suitable solution has not yet been found to the problem of continuously lengthening test times associated with rising test costs.

SUMMARY OF THE INVENTION

The object of the present invention, therefore, is to provide an arrangement and a method for testing a multiplicity of semiconductor chips at the wafer level such that practically all the semiconductor chips or at least a large number thereof on the wafer can be tested in parallel in a simple manner.

In the case of an arrangement or a method of the type mentioned in the introduction, this object is achieved according to the invention by virtue of the fact that an intermediate wiring plane, which can be connected to the tester device, with at least one global test bus for at least a plurality of semiconductor chips and/or at least one test pad with an area for the semiconductor chips which is larger than the area of the bonding pads is provided on the semiconductor wafer.

The invention thus enables an arrangement and a method with which, as required, even all the semiconductor chips on a wafer can be tested in parallel with one another. This is made possible by the additionally provided intermediate wiring plane or layer which is applied to the semiconductor wafer that is processed in this respect, and which serves as a compact interface to the external tester device. On account of this intermediate wiring plane, the previous equipment such as, in particular, probe cards, etc., which must be assigned to each individual type of semiconductor chips, is no longer necessary. After the test has been carried out at the wafer level, the intermediate wiring plane can readily be removed since it is no longer required. Afterwards, the wafer can then be divided into the individual semiconductor chips.

As has already been mentioned above, the intermediate wiring plane comprises a test bus and/or, if appropriate, a plurality of test pads. In this case, the test bus extends over the entire wafer, with the result that, via said test bus, all the required input signals and output signals can be passed to the individual semiconductor chips and, respectively, picked off from said semiconductor chips. The test pads may be distributed over the entire wafer. In contrast to the bonding pads, these test pads can be made much larger, so that they allow simple contact with the tester device.

To form the intermediate wiring plane, it is possible to use any technology that is suitable for this purpose. However, care should be taken to ensure that the required structure size remains in the region of the lateral dimensions of the bonding pads in order that contact can be reliably made with the latter via said intermediate wiring plane. A suitable technology for producing the intermediate wiring plane may be, for example, the use of conductive polymers which are printed onto the surface of the wafer or are patterned by photolithography. Once the test has been carried out, the intermediate wiring plane can then be removed simply using a suitable solvent.

The invention thus treads a completely different path from the previous prior art: instead of further refinement of needle cards, a separate intermediate wiring plane is applied to the wafer and it serves solely for test purposes and is removed again after the tests have been carried out. A series of advantages can thus be obtained which cannot be achieved by the prior art:

All the semiconductor chips of a wafer can be tested in parallel with one another. On account of the global test bus, it is unnecessary for contact to be made individually with the individual semiconductor chips of the wafer.

The layout and dimensions of the test pads are independent of the type of semiconductor chips to be tested, that is to say the specific product to be tested, and, moreover, do not influence the dimension of the chip.

The alignment of pins of the tester device which are brought into contact with the test pads can be relatively rough. In other words, the connection to the tester device is less critical.

The intermediate wiring plane with the test pads and the global test bus can be configured independently of the dimensions of the wafer and/or of the dimensions of the bonding pads.

What is essential to the present invention is, in particular, the use of a separate wiring plane on the top side of the wafer for a parallel test of, if appropriate, all the semiconductor chips of a wafer. By virtue of test pads provided on this separate wiring plane, independence from the dimensions of the semiconductor chips is achieved and impairment of the test pads through specifications of the semiconductor chips is avoided. The layout and position of the test pads on the intermediate wiring plane are practically independent of the layout of the individual semiconductor chips. The configuration of the intermediate wiring plane by means of conductive polymers on the top side of the wafer allows a simple realization of the arrangement according to the invention and of the method according to the invention.

The invention is explained in more detail below with reference to the drawings, in which:

DESCRIPTION OF THE PREFERRED EMBODIMENT

Figure 1:
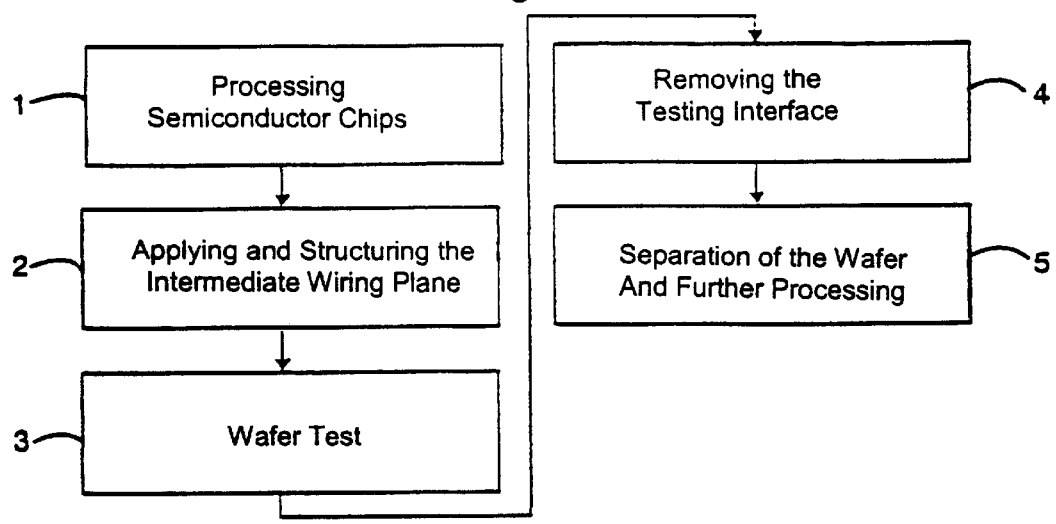
FIG. 1 shows a flow diagram for elucidating the method according to the invention.

As can be seen from the flow diagram of FIG. 1, after the customary processing of semiconductor chips of a wafer made of silicon (see step 1), a film made of a conductive polymer is applied to the surface of the wafer and is then patterned in order to produce a global test bus and test pads which are connected to corresponding bonding pads of the underlying semiconductor chips of the wafer (step 2).

If appropriate, an additional passivation layer 15 (see FIG. 2) may also be applied to the surface of the wafer before the intermediate wiring plane with the conductive polymer is applied. This may be expedient particularly when the test bus is intended to run via non-passivated regions of the semiconductor chips, such as, for example, bonding pads, fuse banks, etc., with which contact is not intended to be made.

The conductive polymers may be applied by printing over the entire wafer. It goes without saying, however, that other technologies can also be used here: by way of example, with the aid of photolithography and subsequent etching, a metal layer that is firstly applied over the whole area by vapor deposition or deposition can be patterned in a desired manner to form the test pads and the global test bus.

It goes without saying that it is also possible, if appropriate, to use a plurality of global test buses. Moreover, the fabrication of the intermediate wiring plane is not restricted to the use of conductive polymers. Rather, any technology which is suitable for producing an intermediate wiring plane with corresponding test pads and/or at least one test bus can be used.

After the actual wafer test has been carried out with the aid of corresponding test signals which are fed via the test bus and the test pads to the bonding pads of the semiconductor chips by the tester device (step 3), and after semiconductor chips that may be defective have been detected, it is possible to remove the intermediate wiring plane as interface between the tester device and the semiconductor chips (step 4). Finally, this may be followed by the customary further processing of the wafer, which provides, in particular, separation of the wafer into the individual semiconductor chips by sawing (step 5).

Figure 2:
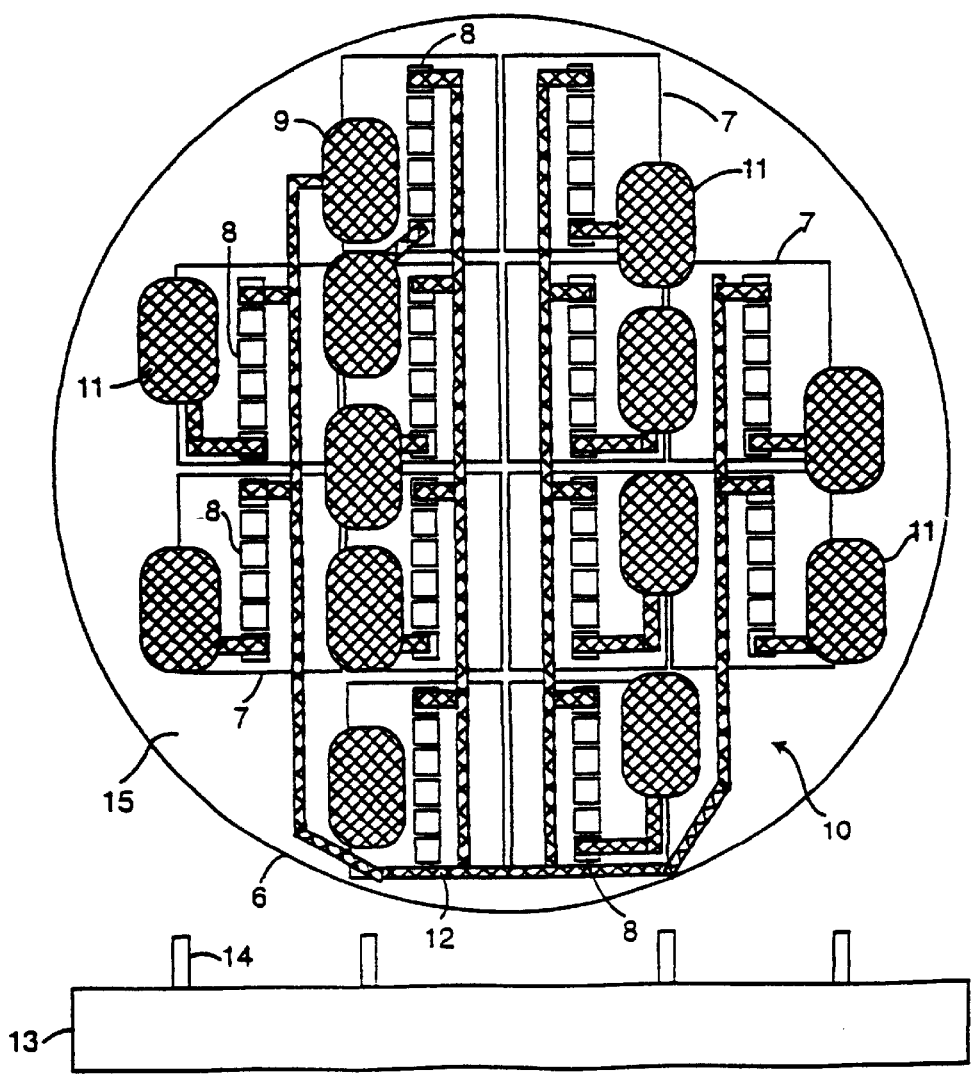
FIG. 2 shows a plan view of the intermediate wiring plane of a wafer with a plurality of semiconductor chips.

FIG. 2 shows a plan view of a wafer 6 made of silicon in which a multiplicity of semiconductor chips 7 are provided. In this example, only twelve semiconductor chips are shown in order to simplify the illustration. It goes without saying that the wafer may, if appropriate, contain several hundred or thousand semiconductor chips 7 of this type.

The individual semiconductor chips 7 are provided with bonding pads 8. During a test, test signals are fed to specific bonding pads 8 in order to test whether the individual semiconductor chips 7 operate entirely satisfactorily in a desired manner.

In order, then, to be able to feed the test signals to these individual bonding pads 8, the arrangement according to the invention provides the intermediate wiring plane made, for example, of a conductive, patterned polymer layer 10, if appropriate on a passivation layer 15, which comprises test pads 11 and a global test bus 12. In this case, a separate test pad 9 is also assigned to the test bus 12, with the result that the tester device can make contact with the test bus 12 just as simply as with the test pads 11.

FIG. 2 shows how contact is made with a respective bonding pad of the individual semiconductor chip 7 by the global test bus 12 and with a respective further bonding pad via a test pad 11. In this way, a global test signal can be fed to all the semiconductor chips 7, while a respective separate test signal can be assigned individually to the semiconductor chips 7 via the test pads 11.

FIG. 2 also schematically shows a side view of a tester device 13 having pins 14 which are assigned to the individual test pads 9 and 11. On account of the relatively large dimensions of the test pads 9 and 11, the positional accuracy of the pins 14 need not be extremely high, in contrast to the situation hitherto for needles of needle cards.

Key to FIG. 1:

1 Processing of semiconductor chips
2 Application and patterning of the intermediate wiring plane
3 Wafer test
4 Removal of the test interface
5 Separation of wafer and further processing

I claim:

1. A method of testing a multiplicity of semiconductor chips at a wafer level of a semiconductor wafer, which comprises:

providing a semiconductor wafer having a plurality of semiconductor chips with bonding pads of a given area;

forming an intermediate wiring plane on the semiconductor wafer with one of a global test bus connected to a plurality of the semiconductor chips and at least one test pad connected to a bonding pad and having an area larger than the given area of the bonding pads;

forming the intermediate wiring plane of a conductive polymer; and connecting test signals of a tester device to the semiconductor chips via the intermediate wiring plane.

2. The method according to claim 1, which comprises applying the intermediate wiring plane on a passivation layer provided on a surface of the semiconductor wafer.

3. The method according to claim 1, which comprises printing the polymer layers onto the wafer.

4. The method according to claim 1, which comprises forming the polymer layers by complete-surface application and subsequently pattering the layers.

5. The method according to claim 1, which comprises forming the polymer layers by a photolithographic process and etching.

* * * * *